United States Patent [19]

Vandermark

[11] 4,034,202
[45] July 5, 1977

[54] INTEGRATED CIRCUIT PACK EXTRACTOR

[75] Inventor: Harold F. Vandermark, Blue Bell, Pa.

[73] Assignee: Nu-Concept Computer Systems, Inc., Colmar, Pa.

[22] Filed: May 23, 1975

[21] Appl. No.: 580,260

[52] U.S. Cl. .............................. 219/230; 29/764; 29/426; 219/533; 228/19; 228/51
[51] Int. Cl.² ................... H05B 1/00; B23K 3/00; B25B 27/14
[58] Field of Search .......... 219/227, 228, 229, 230, 219/533; 29/203 H, 203 HM, 426, 427; 228/19, 20, 51, 54, 55

[56] References Cited
UNITED STATES PATENTS

| | | | |
|---|---|---|---|
| 3,230,338 | 1/1966 | Kawecki | 219/230 UX |
| 3,673,384 | 6/1972 | Burman et al. | 219/230 |
| 3,804,320 | 4/1974 | Vandermark | 219/230 X |
| 3,895,214 | 7/1975 | Winter | 219/230 |

Primary Examiner—A. Bartis
Attorney, Agent, or Firm—A. D. Caesar

[57] ABSTRACT

A hand tool for extracting integrated circuit packs from printed circuit boards to which the pins of the pack have been soldered. The tool includes a pair of pivotable arms each of which carries an electrically heated tip. Each tip includes an inside face extending at a very slight angle to a plane bisecting the space between the faces and terminates in a bottom edge. The tool is arranged such that when the arms are moved toward each other the bottom edge of each tip clampingly engages and abuts the pins of a respective side of the pack at portions immediately adjacent to the printed circuit board solder joints but with the remaining inside surface of each tip remote from the remaining portions of the pins above the solder joints so that heat is applied to the pins at the joints but not appreciably to the circuit pack to effect the melting of the solder at the joints. Once the solder has melted the pack can be readily removed from the board.

8 Claims, 8 Drawing Figures

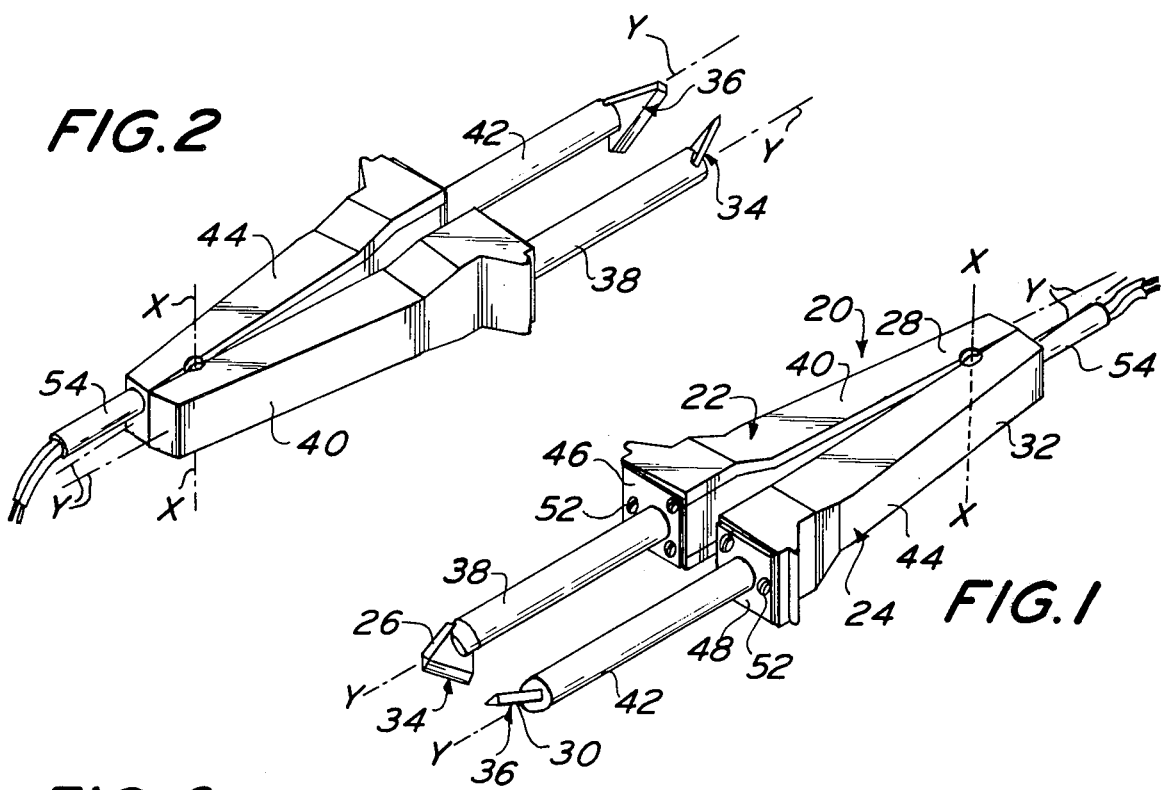
FIG. 2
FIG. 1
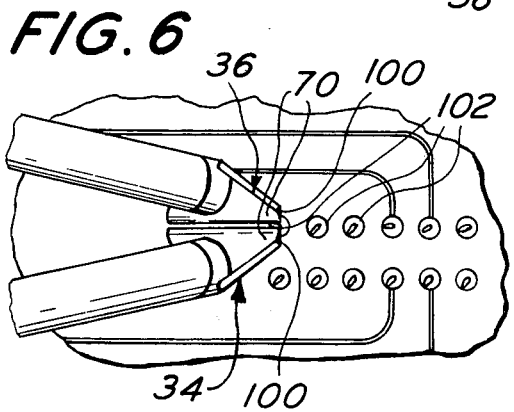
FIG. 6
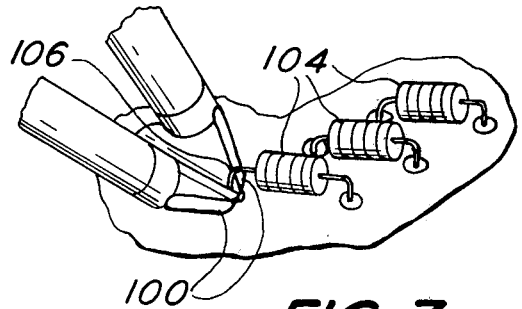
FIG. 7
FIG. 8

INTEGRATED CIRCUIT PACK EXTRACTOR

This invention relates generally to hand held tools and more particularly to hand held tools for desoldering and extracting integrated circuit packs from printed circuit boards.

With the advent of the integrated circuit chip, electronic circuits capable of performing multiple functions and including a large number of components and interconnections are etched onto a chip of semi-conductor material a few millimeters in cross-sectional area. Such chips are disposed within a very small hermetically sealed housing or pack which is typically rectangular in shape. A plurality of leads are connected to selected portions of the integrated circuit chip and are connected to respective pins which pass through selected sidewalls of the pack, normal to the plane thereof. The pins extend in that direction for a very short distance, e.g., 1 millimeter, and are then bent at generally right angles thereto so as to extend generally parallel to the plane of the sidewalls of the pack. The pins terminate slightly below the plane of the bottom of the pack.

Integrated circuit packs are normally mounted on printed circuit boards to electrically interconnect one with another or to electrically interconnect the pack to additional electronic or electrical circuitry.

As is known printed circuit boards include a plurality of conductors printed on an insulating material substrate.

The integrated packs are mounted on the circuit board and are connected to selected printed conductors thereof in the following manner: a plurality of holes are drilled in the board through selected conductors printed thereon. The integrated circuit pack is mounted on one side of the circuit board, with its pins extending through the holes therein, by soldering said pins to the printed circuit conductors contiguous with said holes on the other side of the board. When connected thusly, the bottom side of the pack is disposed on or slightly above the surface of the printed circuit board.

One common type of integrated circuit pack is known as a dual-in-line pack. Such packs include a plurality of pins exiting opposed longitudinaly sides of the pack.

Occasionally it may be necessary to remove or extract a dual-in-line integrated circuit pack from the circuit board to which its pins are soldered. To that end, each of the soldered pins of the pack must be desoldered from the associated printed conductor on the board and the pack removed as a unit before the solder resolidifies. In order to efficiently accomplish the extraction of the pack from the board, it is of considerable importance to uniformly heat all of the soldered pins without excessively heating the integrated circuit chip disposed within the pack. It is also of considerable importance not to deform the pins of the pack during the extraction process or enable the molten solder to induce prolonged heating of the printed circuit board. The closer that the packs are disposed adjacent to one another the harder it is to remove a particular pack without affecting the soldered connections of an adjacent pack.

In my U.S. Pat. No. 3,804,320, assigned to the same assignee as the instant invention, whose disclosure is incorporated by reference herein, there is disclosed and claimed a hand held tool for quickly and easily extracting integrated circuit packs from printed circuit boards to which the packs' pins are soldered. As set forth therein, the tool basically comprises a pair of tongs including elongated arms pivotably connected to each other. Each arm is also pivotable about its longitudinal axis, so as to enable the arm to pivot about two orthagonal axes. Each arm includes an electrically heated tip mounted at the free end thereof and adapted to be brought into contact with the pins of the pack to clampingly engage the pins in order to desolder the pins from the printed circuit board and to extract the pack therefrom when the pins are desoldered.

Each tip is a wedge shaped member and includes a planar surface adapted to thermally engage the pins of an integrated circuit pack which is to be extracted and hook means which work in conjunction with the planar surfaces for clampingly engaging the integrated circuit pack. In one embodiment of the invention disclosed in that application the hook means are formed integrally with the wedge shaped portion and extend normal to the planar surface thereof and flush with the lower edge of the tip.

Extraction of the integrated circuit pack from the board to which it is soldered is carried out via the use of the tool by the user squeezing the arms of the tool together so that the lower edges of the wedge shaped tips contact the pins on the opposed sides of the pack while aligning parallelly to one another and spaced apart by a distance equal to the distance between the portions of the opposed pins. This action ensures that all of the pins are contacted by the tips.

The grasping of the user's hand on the arms also causes the tool's arms to pivot slightly about the respective longitudinal axis, whereupon the planar surfaces of the tips make maximum surface contact with the pins. This action effects the intimate thermal engagement with the pins to result in the rapid and efficient melting of the solder thereof. At the same time that the surfaces of the tips engage the pins in intimate thermal engagement, the hook means pass between adjacent pins and the bottom of the pack to effectively clamp the pack between the tips.

Once the solder on all the pins has melted the tool is moved away from the circuit board carrying with it the integrated circuit pack.

While the invention as set forth in my aforenoted patent operates efficiently in its intended uses, it has been found that on some occasions with some type of circuit packs, e.g., packs whose pins flare outward slightly from the pack's side wall, excess heat may be applied to the pack during the extraction procedure. Such excess heating is the result of the tool's tips contacting the full length of such pins. For salvage-applications, that is wherein the removed integrated circuit pack is to be reused, the application of any excess heat to the pack is to be avoided since such action can result in overheating-induced damage to the pack. In addition, prolonged heat to the integrated circuit board itself is also undesirable as it may result in damage thereto.

Accordingly, it is a general object of this invention to provide an improved hand desoldering device which overcomes the disadvantages of prior art devices.

It is a further object of this invention to provide a hand tool for applying heat to the pins of an integrated circuit pack for a very short time and for localizing the heat at the solder joints to effect the melting of the solder thereat and without damaging the pack.

It is still a further object of this invention to provide a hand tool for applying heat to the pins of an integrated circuit pack for a very short time and for localizing the heat at the solder joints to effect the melting of the solder thereat and for enabling the efficient removal of the pack from the board once the solder has melted.

As is known, during the manufacturing process the pins of an integrated circuit pack are commonly bent at an angle slightly greater than 90° from the sidewalls of the pack so as to flare outward slightly from the pack. This slight deviation enables the pins to contact the outside edges of the holes in which the pins are disposed to thereby mechanically hold the pack in position on the board to facilitate the soldering process. However, while flared pins are valuable for soldering operations they are somewhat detrimental for desoldering operations since the contact of the flared pins on the hole walls creates an outward pressure thereon which acts to impede the quick removal of the pack during desoldering.

Accordingly, it is another object of this invention to provide a hand tool for desoldering integrated circuit packs from printed circuit boards and for overcoming any outward pressure exerted by the pins of the pack on the printed circuit board, thereby facilitating the removal of the pack from the boards quickly after the melting of the solder.

It is yet another object of this invention to provide a tool which effects the rapid melting of the solder while overcoming any outward frictional force created by the pins of an integrated circuit pack and without causing substantial pin deflection at the point of entrance into the pack body, hereby minimizing the chance of mechanical damage to the pack.

It is still a further object of this invention to provide a tool which is effective for straightening bent pins of an integrated circuit pack or other bent component leads.

It is still a further object of this invention to provide a desoldering tool which can be also utilized to effect the soldering of components to printed circuit boards.

These and other objects of the invention are achieved by providing a tool for extracting integrated circuit packs having plural pins disposed on opposed sides thereof from printed circuit boards to which said packs are soldered. The tool comprises a pair of tongs including first and second elongated arms, each being movable with respect to the other and including an electrically heated tip portion mounted thereon. Each tip portion includes an inside face extending at a very slight acute angle to the plane bisecting the space between the faces with each face terminating at a bottom edge. The tips are arranged to be moved towards each other by the movement of the arms toward each other, whereupon the bottom edge of each tip clampingly engages and abuts the pins of a respective side of the pack at portions immediately adjacent to the solder joints but with the remaining inside surface portions of each tip remote from the remaining portions of the pins above the solder joints, so that heat is applied to the pins at the joints, but not appreciably to the circuit pack, to thereby effect the melting of the solder at the joints. The bottom edges of the tips also serve to clampingly engage the pins between them, whereupon when the solder has melted the pack can be readily removed from the board.

Other objects and many of the attendant advantages of this invention will be readily appreciated as the same becomes better understood with reference to the following detailed description when considered in connection with the accompanying drawings wherein:

FIG. 1 is a perspective view of a desoldering device in accordance with this invention;

FIG. 2 is another perspective view of the device shown in FIG. 1;

FIG. 6 is a perspective view of a portion of the device of this invention for straightening the pins of an integrated circuit pack;

FIG. 7 is a perspective view showing a portion of this invention for effecting the desoldering of an electrical component from an integrated circuit board; and FIG. 8 is a perspective view of a portion of this invention for effecting the desoldering of a three-lead electrical component.

Referring now in greater detail to the various figures of the drawing wherein like reference characters refer to like parts, an integrated circuit pack extraction tool embodying the present invention is shown at 20 in FIG. 1.

Figure 3:
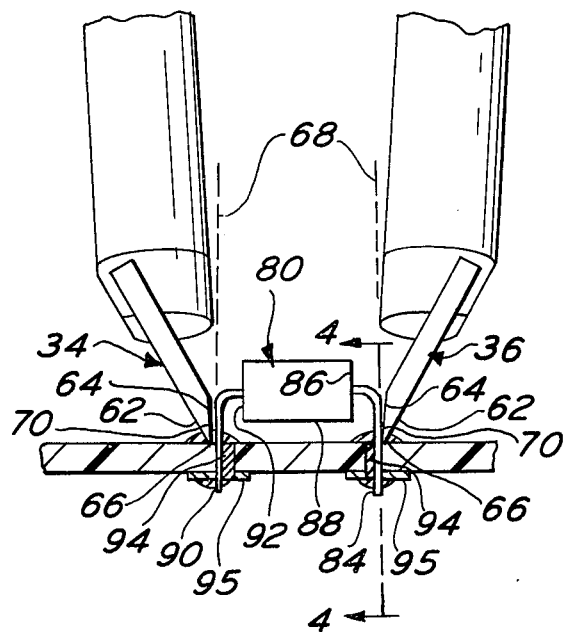
FIG. 3 is an elevational view, partially in section, showing a portion of the device in operation desoldering an integrated circuit pack from an integrated circuit board.

As can be seen therein, tool 20 basically comprises a pair of tongs including first and second elongated arms 22 and 24. Arm 22 includes a free end 26 and a pivot end 28. Arm 24 includes a free end 30 and a pivot end 32. The arms are coupled to one another at their pivot ends and are pivotably connected about a first axis X—X. An electrically heated tip member 34 is mounted at the free end 26 of arm 22 and a similar electrically heated tip member 36 is mounted at the free end 30 of arm 24. The tips are provided to clampingly engage the pins of an integrated circuit pack to desolder the pins from a printed circuit board and to extract the pack therefrom when the pins are desoldered.

Arm 22 includes a tubular shaft 38 on which tip member 34 is mounted and a handle 40. In a similar manner arm 24 includes a tubular shaft 42 to which tip member 36 is mounted and a handle 44. Planar heat shields 46 and 48 are provided to mount the shafts 38 and 42, respectively, on handles 40 and 44, respectively, and to thermally shield the handles from the shafts.

The handles are disposed adjacent to the respective pivot ends of the arms and are formed of an electrically and thermally insulative material. When the handles are manually gripped and squeezed, the arms 22 and 24 pivot about the axis X—X to move their respective tip members 34 and 36 adjacent to one another.

The tip members are adapted, when the arms are pivoted about the axis X—X, for clamping therebetween the plural pins extending along the opposed sides of an integrated circuit pack, for heating the pins to desolder the pins from the circuit board to which the pins are soldered and for removing the pack from the board when the pins are desoldered.

A resilient spring means (not shown) is connected between the handles 40 and 44 to bias the elongated arms to an open position wherein the top members 34 and 36 are spaced apart by a distance which is substantially greater than the width of the integrated circuit pack. In FIG. 1 the tool 20 is shown in such an open position. The resilient means also serves to oppose the manual force applied to the handles by the user when an integrated circuit pack is being removed from the printed circuit board. This action prevents excessive clamping force from being applied to the pins of the integrated circuit pack, which force may tend to deform the pins.

The resilient means is constructed in accordance with the teachings of my above noted patent and is connected to associated components (not shown), also constructed in accordance with the teachings of my afore noted patent, for enabling the handles 40 and 44 to be pivotably moved relative to one another about both the axis X—X, described heretofore, as well as to enable arms 22 and 24 to pivot slightly about their longitudinal axis which is normal to the axis X—X. Each longitudinal axis is shown as Y—Y.

The heat shield plates 46 and 48 are screwed onto the handles 40 and 44 via threaded fasteners 52.

Disposed within the interior of the tubular shafts 38 and 42 are cylindrical heating elements (not shown) which comprise an electrical heating coil disposed within a ceramic casing. Electrical leads (not shown) are connected to respective ends of the heating coil and extend out through the tubular shaft, the associated handles and exit the tool in the form of a cable 54.

The electrical heating element serves to heat the thermally conductive tip members of the tool. To that end, each tip member includes a portion which abuts the heating element disposed in the shaft on which said tip in mounted. Accordingly, heat generated in the heating coil of the heating element is conducted through the contiguous surfaces of the ceramic casing and the tip portion to effectuate the heating of the tip.

As will be described in detail hereinafter, each tip includes a portion arranged to abut in intimate thermal engagement the pins of one side of the integrated circuit pack which is being extracted to provide solder melting heat thereto and for effecting the clamping engagement of the pins of the pack between the opposed tip portions. To that end, as can be seen in FIG. 3, each tip includes a wedge shaped portion having an outside face 62, and an inside face 64 merging together at a narrow tapered edge 66. Each tip is mounted on its associated arm such that the inside face of the tip lies at a very slight acute angle to the plane which bisects the space between the tips. In the view shown in FIG. 3 the plane bisecting the tips is denoted by the reference numeral 68. As can be seen therein, the deviation between the planar inside surface 64 of each tip and the plane 68 is very shallow, e.g., one-half a degree.

As will be described in detail later, the shallow angular orientation of each inside face 64 establishes a narrow band 70 on the surface of inside face 64 contiguous with the edge 66. Each band 70 serves as the heating surface of the associated tip and forms the only portion of the tip which contacts the pins of the pack during the desoldering operation. To that end, the tool 20 is arranged so that the narrow band portions of each tip is brought into contact with the pins of the pack to be desoldered only at the solder joints and remote from the remaining portions of pins in the pack. Such narrow contact enables the desoldering heat to be localized at the solder joint and without appreciably heating the remaining portions of the pins, that is the portions located between the solder joint and the pack housing, thereby protecting the contents of the pack from heat-induced damage.

Figure 4:
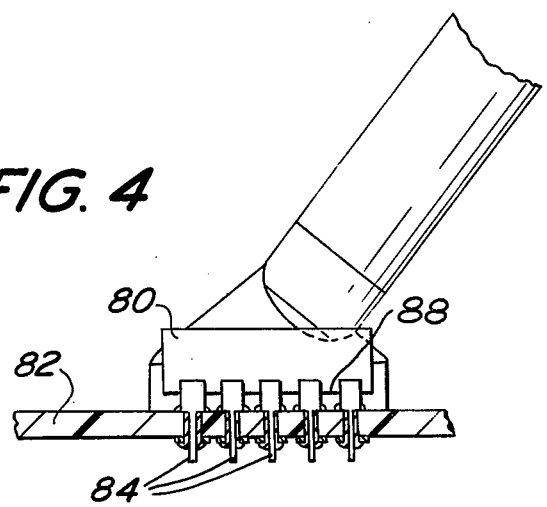
FIG. 4 is a sectional view taken along line 4—4 of FIG. 3.
Figure 5:
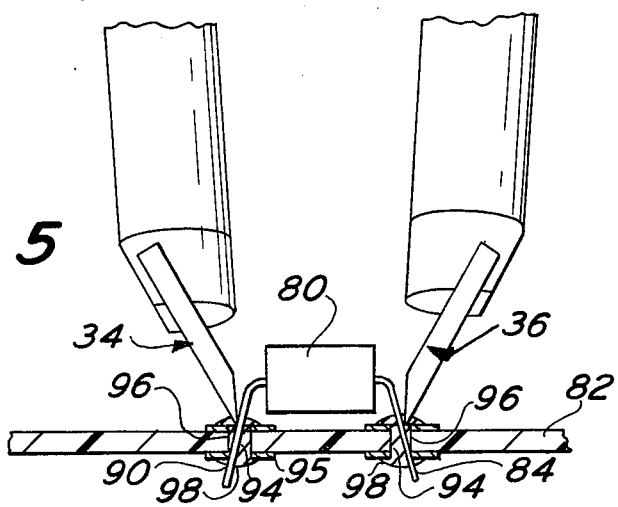
FIG. 5 is a view similar to that of FIG. 3 showing the removal of an integrated circuit pack having exaggerated flared pins from an integrated circuit board.

Operation of the tool 20 can best be appreciated with reference to FIGS. 3, 4 and 5 and assuming that a dual-in-line integrated circuit pack 80 is to be extracted from the printed circuit board 82 to which its pins have been soldered.

Pack 80 is of a conventional type and includes plural pins 84 disposed along its longitudinal side wall 86, which pins extend for a short distance normal thereto and then bend at slightly greater than right angles thereto to extend downward for some distance below the plane of the bottom wall 88 of the pack. Pack 80 also includes plural pins 90 disposed along its longitudinally opposed side wall 92 which extends a short distance normal thereto and then bend at greater than right angles to extend downward below the plane of the bottom wall of the pack. The pins 84 and 90 extend through associated holes 94 which are drilled in the printed circuit board contiguous with the electrical conductors 95 printed thereon. Owing to the slightly greater than 90° angular orientation of the pins, the pins flare outward, see the exaggerated view in FIG. 5, so as to make contact with the outside edges 96 of the holes 94 in the printed circuit board. The outward pressure exerted by the pins serves to hold the pack in place on the board to facilitate the soldering of the pack in place. The soldered connections are denoted by the reference numeral 98 in FIG. 5. As can be seen in that Figure, when soldered thusly, the bottom wall 88 of the circuit pack 80 is spaced slightly above the top surface of the printed circuit board, although in some applications the pack can be disposed directly on the board.

Extraction of the integrated circuit pack 80 from the board 82 is carried out in the following manner: The handles of the tool 20 are held in the user's hands lightly so that the spring means maintains the arms of the tool in their open position as shown in FIG. 1. The tool is then moved into position adjacent the integrated circuit pack 80 to be removed, with the spaced apart tips 34 and 36 of the tool closely adjacent to the side walls 92 and 86, respectively, of the pack. The handles of the tool are squeezed together such that the tapered lower edges 66 of the wedge shaped tips align parallel to one another and spaced apart by a distance equal to the distance between the portions of the opposed pins extending along the side walls of the integrated circuit pack. This action ensures that the narrow bands 70 on the surface of each face 64 of each tip contacts all of the pins on that side of the circuit pack at the solder joints. By virtue of the fact that the faces 64 deviate from the plane 68, only the portion 70 of each tip contacts the associated solder joints and pins thereat, with the remaining portions of said tip being spaced from the remaining portions of those pins. This action ensures that the heating is localized at the solder joints and that no appreciable heating of the pack or its contents results.

Since the arms of the instant tool 20 are enabled to pivot slightly with respect to one another about their longitudinal axes, like the arms of the device of my aforenoted patent, the tapered edges 66 of tips of this device and their respective contiguous heating bands 70 align parallel with one another. By virtue of the parallel alignment of the heating surfaces 70, maximum thermal engagement is made between the heated tip portions of the tool and the integrated circuit pack pins, thereby effecting the rapid and efficient melting of the solder connecting the integrated circuit pack pins to the circuit board conductors. The rapid desoldering of the integrated circuit pack pins minimizes the chance of printed circuit board damage by reducing the time the heat of the molten solder in the printed circuit board holes is transferred into the board material. In addition, the narrow tapered edges 66 enables the tips to get between closely adjacent integrated circuit packs mounted on a circuit board in order to extract one of the packs without effecting the connection between any other packs which may be soldered to the board.

It should be appreciated from the foregoing that the tips of the instant invention are extremely efficient for effecting the melting of the solder at the solder joint and for protecting the pack from possible overheat damage since the point of thermal engagement with the pins is at a point farthest away from the point at which the pins enter the body of the pack itself. Furthermore, since the point of thermal engagement with each pin is at the remotest point from the entrance point to the pack, the interposed portion of the pin, that is the portion between the point of thermal engagement and the pack itself, acts as heat dissipating means. Accordingly, heat rising within the pin from the point of thermal engagement with the tip is partially dissipated into the air surrounding the pin. With the instant device it has been found that the entire operation, that is the melting of the solder and the removal of the integrated circuit pack from the printed circuit board can be accomplished in approximately 3 to 5 seconds.

Once the solder has liquified, the tool 20 of the instant invention is operative to effect the extraction of the pack from the printed circuit board. In order to accomplish this action the tool 20 is operative to overcome the outward pressure produced by the pins of the pack against the outside edges of the circuit board holes in which the pins are soldered. To that end, as should be appreciated to those skilled in the art the tool 20 operates as a lever on the pins to flex them inward with very little applied force repaired to overcome the frictional engagement between the pins and holes. As can be seen in the exaggerated view of FIG. 5, the portions of the tips 34 and 36 which make contact with the pins, do so only at the solder joints, which is the maximum distance away from the point at which the pin enters the pack body, which latter point serves as the pivot or the fulcrum point. Accordingly, upon the squeezing of the handles of the tool together a minimum amount of energy is required to overcome the outward pressure of the pins against the outside edges of the printed circuit board holes due to the mechanical advantage of the "lever" action. It has been found that a gripping force of less than two pounds is all that is necessary to overcome the force of the pins of a conventional 14-16 pin integrated circuit pack while the solder is in the molten state.

The squeezing of the handles causes the pins to be pivoted slightly out of engagement with the outside edges of the walls of the mounting holes, whereupon the integrated circuit pack is firmly clamped or gripped between the opposed tool tips. Since the solder is molten and since the outward pin pressure is overcome, the integrated circuit pack can be readily carried off of the printed circuit board.

Another desirable feature of the use of the tool 20 is that since the tip portions make contact at the solder joint at the maximum distance away from the point at which the pins enter the pack body, mechanical movement of the pins at the body is minimized, thereby protecting the pack from mechanically induced damage.

As will be appreciated by those skilled in the art, the tool 20 of the instant invention can be used to straighten bent pins of integrated circuit packs or other component leads. This action is shown in FIG. 6 wherein the printed circuit board is turned upside down, that is, the components facing downward. The leading edges 100 of the heating surfaces 70 of the tool tips are placed on either side of the pins 102 to be straightened to melt any interfering solder. When the solder is in a molten state the handles of the tool are squeezed together causing the tips to grasp the lead between them. The pin can then be straightened by merely pulling upward on the tool normal to the plane of the circuit board.

Desoldering and removal of components other than integrated circuit packs through the use of the tool 20 can be accomplished in the following manner as shown in FIG. 7: Components, 104, such as resistors, capacitors, diodes and other one and two lead components can be removed from the top side of the board, that is the component side, by placing the leading edges 100 of the heating surfaces 70 of the tips of the tool on either side of one lead 106 of the component in a tweezer-like fashion to melt any interfering solder. When the solder is in a molten state the handles of the tool are then squeezed causing the tips to grasp the component lead 106 tightly between them. This action causes the solder to melt in the printed circuit board hole. When this occurs sufficient pressure can be applied to the handles to firmly grip the component lead and pull it free from the board. The same procedure can then be utilized to free the remaining lead of the component from the printed circuit board.

It should be pointed out at this juncture that the tool 20 is also effective for soldering components such as resistors, capacitors, diodes and other one and two lead components onto a printed circuit board by merely reversing the immediately set forth procedure. To that end, one component lead is grasped by the tips of the tool and is placed into the printed circuit board hole. Since the component lead is now virtually an extension of the tips of the tool it is not necessary to remove the remaining solder from the hole since the component lead will melt the solder and allow entry of the lead into the hole. When the lead is in the hole additional solder may be melted into the joint if desired. The same procedure is applied to the second lead resulting in the complete insertion and soldering of the component on the printed circuit board.

Three-lead components, such as transistors, can be removed from printed circuit boards in the following manner as shown with regard to FIG. 8. As can be seen therein, the printed circuit board is turned upside down, such that the component side faces down. Two leads 108 and 110 of the three leads of the component to be desoldered are contacted by the heating surface 70 of one of the tips 34 of the tool 20, while the remaining lead 112 is contacted by the heating surface 70 of the other tip 36. The application of heat results in the melting of the solder in the associated printed circuit board holes. When the solder has melted sufficiently the component is grasped from the component side of the board and is pulled free of the board.

It should be appreciated from the foregoing that the device of the instant invention is extremely simple in construction and is effective for quickly, easily and safely removing electronic components from printed circuit boards to which they are soldered.

Without further elaboration, the foregoing will so fully illustrate my invention, that others may, by applying current or future knowledge, readily adapt the same for use under various conditions of service.

What is claimed as the invention is:

1. A tool for extracting electrical components having at least one pin from printed circuit boards to which said pin is soldered, comprising: a pair of tongs including first and second elongated arms, each arm being movable with respect to each other and including an electrically heated tip portion mounted thereon, each tip portion including a generally planar inside face extending at at least a half degree angle to a plane bisecting the space between said faces, each face terminating at a continuous linear bottom edge extending at an acute angle to the longitudinal axis of the arm upon which said tip is mounted so that when said tip is in contact with said pin, said arm extends at an acute angle to said board to provide visibility of said pack, said tips being arranged to be moved toward each other by the movement of said arms toward each other, whereupon the linear bottom edge of each tip clampingly engages and abuts said pin at portions immediately adjacent to the printed circuit board solder joint but with the remaining inside surface portions of each tip being remote from the remaining portions of the pin above the solder joint so that heat is applied to the pin at said joint, but not appreciably to the component, to effect the melting of the solder at said joint, said bottom edges clampingly engaging the pin therebetween, whereupon when said solder is melted the pack can be readily removed from said board by the movement of said tool away from said board.

2. The tool of claim 1 wherein said component is an integrated circuit pack having plural pins disposed along opposite sides thereof, said pins being soldered to a printed circuit board at respective joints and wherein the bottom edge of each tip clampingly engages and abuts the pins of a respective side of the pack immediately adjacent to said joints.

3. The tool of claim 2 wherein said arms are pivotable about a first axis, said tip portions are mounted on said arms at an angle which ensures that when said arms are pivoted about said first axis, the tip portions of said first arm contact all of the pins on one side of the pack and the tip portions of said second arm contact all of the pins on the opposed side of the pack.

4. The tool as specified in claim 3 wherein said tip portions are wedge shaped.

5. The tool as specified in claim 4 wherein said arms are slightly pivotable about a second axis which is substantially normal to said first axis to enable the bottom edges of said tips to abut in intimate thermal engagement all of the pins of said pack at the solder joints along the sides of said packs when said arms are pivoted about both of said axes.

6. The tool as specified in claim 4 wherein each of said arms includes an electric heating means for heating said tip portions.

7. The tool as specified in claim 6 wherein each of said arms includes an electrically and thermally insulative handle.

8. The tool as specified in claim 7 wherein said electrical heating means comprises a heating coil disposed within a ceramic casing.

* * * * *